United States Patent
Colby et al.

(10) Patent No.: US 8,091,433 B2
(45) Date of Patent: Jan. 10, 2012

(54) IONISER TYPE GAS METER HAVING MODULATING ELECTRODE DOWNSTREAM OF IONISER

(75) Inventors: Edward Grellier Colby, Cambridge (GB); Hans Joachim Steiner, Cambridge (GB); Kimon Sopoulos, Cambridge (GB); Matthew Emmanuel Milton Storkey, Cambridge (GB); Simon Adam Shakepeare, Cambridge (GB)

(73) Assignee: Sentec Limited, Cambridge (GB)

( * ) Notice: Subject to any disclaimer, the term of this patent is extended or adjusted under 35 U.S.C. 154(b) by 338 days.

(21) Appl. No.: 12/097,517

(22) PCT Filed: Oct. 5, 2006

(86) PCT No.: PCT/GB2006/003710
§ 371 (c)(1),
(2), (4) Date: May 26, 2009

(87) PCT Pub. No.: WO2007/068869
PCT Pub. Date: Jun. 21, 2007

(65) Prior Publication Data
US 2010/0199781 A1   Aug. 12, 2010

(30) Foreign Application Priority Data

Dec. 13, 2005 (GB) .................................. 0525305.9
Dec. 13, 2005 (GB) .................................. 0525307.5

(51) Int. Cl.
*G01F 1/64* (2006.01)
(52) U.S. Cl. .................. 73/861.09; 73/861.05; 250/395
(58) Field of Classification Search ..................... None
See application file for complete search history.

(56) References Cited

U.S. PATENT DOCUMENTS

| 2,921,198 | A | * | 1/1960 | Warmoltz et al. | ............. 250/290 |
| 4,272,995 | A | * | 6/1981 | Weistra | ..................... 73/861.09 |
| 6,872,238 | B1 | * | 3/2005 | Truce | ............................... 95/29 |

* cited by examiner

*Primary Examiner* — Harshad Patel
(74) *Attorney, Agent, or Firm* — Thorpe North & Western LLP (57) ABSTRACT

A gas meter gas a conduit for passage of a gas flow; an ioniser arranged to ionise the gas flow in the conduit; a modulating electrode structure arranged for modulating the ion distribution in the ionised gas flow; and at least a detecting electrode structure downstream of the modulating electrode structure arranged for detecting the modulated ion distribution in the ionised gas flow. The modulating electrode structure is arranged downstream of the ioniser and is configured to generate an electrical field which is substantial in a parallel to the direction of the gas flow.

18 Claims, 4 Drawing Sheets

IONISER TYPE GAS METER HAVING MODULATING ELECTRODE DOWNSTREAM OF IONISER

FIELD OF THE INVENTION

This invention relates to the field of volumetric gas metering. The gas metering technology described herein is particularly suited for use in a residential utility gas meter.

BACKGROUND TO THE INVENTION

The most common form of volumetric residential gas meter is the diaphragm gas meter. This is a mechanical device working on the positive displacement principle, allowing a fixed volume of gas through per complete cycle. Mechanical meters are subject to wear in normal operation, which leads to increasing inaccuracy with time, and the eventual possibility of complete failure. The increasing prevalence of automatic meter reading (AMR) means that very often some form of encoder must be interfaced to the mechanical readout, in order to be able to read the consumption information automatically.

It is desirable to provide a gas meter that contains no moving parts, i.e. a static gas meter, in which a measurement of the volume of gas consumed is available directly in an electronic form. Other benefits follow from such an implementation, including the ability to set more complex tariffs based on time of use, peak demand, or local variations in gas pricing, or the ability to share information with other residential energy sources such as electricity, oil or renewable energy sources.

Three types of static volumetric gas meters have been developed. The first is the ultrasonic time-of-flight meter, which is available commercially for niche applications that can bear the high cost of this kind of meter. The second known technology is the thermal mass-flow meter, which is a relatively new addition to the field, and uses a bypass method and a micro-machined sensor. The third type is a fluidic oscillator meter, which was developed in the 1950's. All of these metering technologies share the disadvantage that they are more expensive than mechanical meters, and require significant battery power, which also increases the cost.

U.S. Pat. No. 3,688,106 (Brain) describes a meter for measuring the velocity of gas in a duct. The meter has an ion source and two ion collectors, so that gas in the duct is first ionized and then passes the collectors. A voltage pulse is applied to the first collector and the interval between this pulse and the resulting effect in the number of ions collected at the second collector is measured to give gas velocity. Gas density is measured by determining the number of ions collected between pulses at the second collector, and mass flow is obtained from the product of velocity and density. In this system, the voltage pulse applied to the first collector is a 100 Hz square wave and a voltage of 120 volts is applied across the second collector. The high voltage and high modulation frequency make this design unsuitable for low-voltage battery-powered operation required by a domestic gas meter. Other configurations of ionisation velocity gas meters are described in U.S. Pat. No. 3,842,670 and U.S. Pat. No. 2,632,326.

It would be desirable to provide a gas meter of the general type described in U.S. Pat. No. 3,688,106 (Brain), which would be capable of functioning with an operating voltage of a few volts, so that the meter could be powered economically by standard batteries. With the metering geometry described by Brain, however, it is essential that the electrodes of the collectors are spaced sufficiently that the collectors present little or no impedance to gas flow. Thus, an operating voltage in excess of one hundred volts is required to provide a sufficiently large electric field at the collectors for the meter to function. For the same electric field to be generated with an operating voltage of only a few volts, the duct in which the Brain meter is mounted would need to be one hundred times smaller in diameter, which would significantly impede the flow of a domestic gas supply.

This invention, at least in its preferred embodiments, seeks to provide an improved volumetric gas meter operating on the principle of the electrical manipulation and detection of an ionised gas stream, using the underlying principle that the velocity field of the gas interacts with the ionisation distribution, and alters the detected signals. In particular embodiments, the gas meter is especially suitable for metering of gas usage from a national or regional supply network.

SUMMARY OF THE INVENTION

Accordingly, viewed from one aspect this invention provides a gas meter comprising a conduit for passage of a gas flow and an ioniser arranged to ionise the gas flow in the conduit, in use. A modulating electrode structure downstream of the ioniser is arranged for modulating the ion distribution in the ionised gas flow. At least a first detecting electrode structure downstream of the modulating electrode structure is arranged for detecting the modulated ion distribution in the ionised gas flow. At least one of the modulating electrode structure and the detecting electrode structure is configured to generate an electrical field having at least a substantial component parallel to the direction of the gas flow.

Thus, according to the invention, an electrode structure generates an electric field having at least a substantial component parallel to the direction of the gas flow. By arranging the electric field parallel, rather than perpendicular, to the direction of gas flow as is the case in the prior art, the electric field strength can be adjusted by changing the spacing between electrodes of the electrode structure, and this change of spacing need not affect the gas flow through the conduit. In this way, the fluid dynamic requirements of the gas meter can be made independent of the electrical requirements and this allows a gas meter to be created that can operate at sufficiently low voltages for use as a domestic gas meter.

The modulating electrode structure may be configured to generate an electrical field having at least a substantial component parallel to the direction of the gas flow, for example to select a particular polarity of ion for the downstream ionised gas flow. Alternatively or in addition, the detecting electrode structure may be configured to generate an electrical field having at least a substantial component parallel to the direction of the gas flow, for example to detect selectively a particular polarity of ion.

In particular embodiments, the generated electrical field is substantially parallel to the direction of the gas flow. However, this is not essential. For example, the electric field may include a component substantially parallel to the direction of the gas flow, as well as a component substantially perpendicular to the direction of the gas flow.

The modulating electrode structure and/or the detecting electrode structure may take any suitable shape and configuration. For example, the electrode structures may be arcuate, semi-cylindrical, hemispherical, etc. In a typical embodiment, however, the modulating electrode structure comprises a pair of opposed substantially planar electrodes arranged substantially perpendicularly to the direction of the gas flow. Alternatively or in addition, the detecting electrode structure may comprise a pair of opposed substantially planar electrodes arranged substantially perpendicularly to the direction of the gas flow. A "pair" of electrodes does not imply that the electrodes are identical, even though they may be.

In general, the electrodes are spaced in the direction of the gas flow. The spacing of the electrodes may be less than 1 mm, preferably less than 0.25 mm. Typically, the electric field is generated between the electrodes, in use.

In a preferred embodiment, the electrodes each have a plurality of apertures defined therein for passage of the gas flow therethrough.

This in itself is believed to be a novel configuration. Thus, viewed from a further aspect this invention provides a gas meter comprising a conduit for passage of a gas flow, in use, and an ioniser arranged to ionise the gas flow in the conduit, in use. A modulating electrode structure downstream of the ioniser is arranged for modulating the ion distribution in the ionised gas flow. At least a first detecting electrode structure downstream of the modulating electrode structure is arranged for detecting the modulated ion distribution in the ionised gas flow. At least one of the modulating electrode structure and the detecting electrode structure comprises at least one electrode arranged transversely to the direction of gas flow and having a plurality of apertures defined therein for passage of the gas flow therethrough. The number of apertures may be in excess of ten.

Thus, according to this aspect of the invention, the electrode is configured to allow the gas flow to pass through the electrode. In this way, the electrode can be positioned to achieve the desired electrical or electromagnetic effect without adversely affecting the flow of gas through the meter.

The electrode is arranged transversely to the direction of gas flow. This means that the electrode is not parallel to the direction of gas flow. Thus, the gas flow impinges on the electrode to some extent. Typically, the electrode is arranged perpendicularly to the direction of gas flow. In this way, the electrical modulation or detection of the ionised gas flow occurs in the shortest possible distance along the conduit, such that the spatial resolution, and hence detection accuracy, of the gas meter is maximised. Furthermore, a perpendicular electrode does not tend to deflect the gas flow towards the walls of the conduit.

The electrode may comprise a plurality of conductors, with the apertures provided by the spaces between adjacent conductors. The conductors need not be formed in a single unit, but may be provided by discrete conductors. However, the conductors of one electrode are all connected to the same electrical potential, in use. Thus, the electrode may take the form of an arrangement of wires, for example parallel wires. Alternatively, the electrode may take the form a single piece, typically of metal, having the apertures formed therein. The apertures may be moulded, cut, etched, stamped or otherwise defined in the metal. The apertures may be holes, slots, perforations or any other suitable aperture.

In the preferred arrangement, the electrodes are in the form of a mesh or grid. Typically, the grid is a regular array of apertures defined between adjacent conductors. The array may extend in one dimension, for example a grid of parallel slots, or two dimensions, for example a grid of horizontal and vertical conductors.

The pitch of the mesh may be selected to maximise the electrical effectiveness of the electrode. In embodiments of the invention, the pitch of the mesh is less than 5 mm, preferably less than 3 mm. The fill factor for the mesh is desirably as small as possible to ensure maximum gas flow. In embodiments of the invention, the fill factor of the mesh is less than 30%, preferably less than 20%. In general, the construction of the electrodes for the modulating electrode structure and the detecting electrode structure is selected to maximise modulation or detection efficiency. However, for reasons of manufacturing expediency, for example, the electrodes may be chosen to be identical.

In embodiments of the invention, the gas meter comprises a pair of electrodes arranged transversely to the direction of gas flow and having a plurality of apertures defined therein for passage of the gas flow therethrough. Typically, the electrodes are identical, but this is not essential.

The apertures in one electrode of the pair may be offset in a direction transverse to the direction of gas flow relative to the apertures in the other electrode of the pair. This arrangement is particularly advantageous, because the electric field between the electrodes can include a component in the direction perpendicular to the plane of the electrodes. This is particularly advantageous where the electrodes are the modulating electrodes, because a component of the electric field in the direction perpendicular to the plane of the electrodes assists in directing ions towards the electrodes for capture and therefore increases the modulation effectiveness of the electrode structure.

The pair of electrodes may be spaced in the direction of gas flow. Alternatively, the electrodes may be substantially coplanar. For example, the conductors of one electrode may be located in the spaces (apertures) between the conductors of the other electrode. In other words, the electrodes may be interdigitated. With an arrangement of this kind, the electric field generated by the electrode structure may be entirely perpendicular to the direction of gas flow.

In a preferred embodiment, the offset between the apertures of respective electrodes of the pair is substantially equal to half the spacing between adjacent apertures of one of the electrodes. In this way, any component of the electric field in the direction perpendicular to the plane of the electrodes is maximised.

The modulating electrode structure may comprise an upstream electrode and a downstream electrode. A respective modulating potential may be applied, in use, to each electrode to modulate the ion distribution in the ionised gas flow. The modulating potential applied to the downstream electrode may be of the opposite polarity to the modulating potential applied to the upstream electrode and of a magnitude selected such that, downstream of the modulating electrode structure, the electric field due to the upstream electrode is cancelled by the electric field due to the downstream electrode.

This in itself is believed to be a novel configuration. Thus, viewed from a further aspect this invention provides a gas meter comprising a conduit for passage of a gas flow, in use and an ioniser arranged to ionise the gas flow in the conduit, in use. A modulating electrode structure downstream of the ioniser is arranged for modulating the ion distribution in the ionised gas flow. At least a first detecting electrode structure downstream of the modulating electrode structure is arranged for detecting the modulated ion distribution in the ionised gas flow. The modulating electrode structure comprises an upstream electrode and a downstream electrode, and a respective modulating potential is applied, in use, to each electrode to modulate the ion distribution in the ionised gas flow. The modulating potential applied to the downstream electrode is of the opposite polarity to the modulating potential applied to the upstream electrode and of a magnitude selected such that, downstream of the modulating electrode structure, the electric field due to the upstream electrode is cancelled by the electric field due to the downstream electrode.

With this arrangement, the modulating potentials can be used to ensure that the electric fields associated with the modulating electrode structure do not affect directly the operation of the detecting electrode structure.

The modulating electrode structure may be arranged to capture preferentially ions of one polarity, whereby to generate an ionised gas flow comprising a majority of ions of the opposite polarity. An alternating modulating potential may be applied to the modulating electrode structure so that the modulating electrode structure captures sequentially ions of one polarity and subsequently the opposite polarity, whereby to generate an ionised gas flow comprising a sequence of regions having a majority of ions of alternating polarity. In this way, the gas flow is encoded with an alternating signal. A comparison of the delay between the signal received at the detecting electrode structure and the modulating potential provides an indication of the gas flow rate through the conduit.

The detecting electrode structure may comprise at least one electrode connected to a source of charge, whereby movement of the ionised gas flow having a majority of ions of one polarity relative to the electrode causes a redistribution of charge in the electrode, which generates a current indicative of the ion distribution between the electrode and the charge source.

This in itself is believed to be a novel configuration. Thus, viewed from a further aspect this invention provides a gas meter comprising a conduit for passage of a gas flow, in use and an ioniser arranged to ionise the gas flow in the conduit, in use. A modulating electrode structure downstream of the ioniser is arranged for modulating the ion distribution in the ionised gas flow. At least a first detecting electrode structure downstream of the modulating electrode structure is arranged for detecting the modulated ion distribution in the ionised gas flow. The modulating electrode structure is arranged to capture ions of one polarity, whereby to generate an ionised gas flow comprising a majority of ions of the opposite polarity. The detecting electrode structure comprises at least one electrode connected to a source of charge, whereby, in use, movement of the ionised gas flow having a majority of ions of one polarity relative to the electrode causes a redistribution of charge in the electrode, which generates a current indicative of the ion distribution between the electrode and the charge source. Typically, the source of charge is ground potential.

According to this aspect of the invention, the detecting electrode structure detects the passing ionised gas flow, which may be of alternating polarity, by virtue of the current generated due to the redistribution of charge in electrode structure. This has the significant advantage, that an electric field is not required between the electrodes of a detecting electrode structure. Furthermore, detection is achieved without capturing ions such that a series of such detecting electrode structures may be arranged along the conduit.

In this arrangement, it is possible for the detecting electrode structure to comprise only a single electrode, which is responsive to the passing ionised gas flow. However, in a particular embodiment, the detecting electrode structure comprises an upstream electrode and a downstream electrode, each connected to a source of charge. The upstream electrode shields the downstream electrode from the approaching ionised gas flow and provides a better-defined detection signal from the downstream electrode.

The gas meter may comprise a second detecting electrode structure downstream of the first detecting electrode structure, each detecting electrode structure arranged for detecting the modulated ion distribution in the ionised gas flow.

This in itself is believed to be a novel configuration. Thus, viewed from a further aspect this invention provides a gas meter comprising a conduit for passage of a gas flow, in use and an ioniser arranged to ionise the gas flow in the conduit, in use. A modulating electrode structure downstream of the ioniser is arranged for modulating the ion distribution in the ionised gas flow. A first detecting electrode structure downstream of the modulating electrode structure is arranged for detecting the modulated ion distribution in the ionised gas flow. A second detecting electrode structure downstream of the modulating electrode structure arranged for detecting the modulated ion distribution in the ionised gas flow.

The provision of a second detecting electrode structure can be used to increase the dynamic range of gas meter. Thus, the first detecting electrode structure may be arranged to detect the ion distribution at relatively low flow rates and the second detecting electrode structure may be arranged to detect the ion distribution at higher flow rates when the ion cloud will travel further during the same time period. In particular embodiments, the distance from the modulating electrode structure to the first detecting electrode structure may be less than 10 mm. In particular embodiments, the distance from the modulating electrode structure to the second detecting electrode structure may be greater than 50 mm. Typically, the distance from the modulating electrode structure to the second detecting electrode structure is less than 100 mm.

The first detecting electrode structure may be arranged to capture preferentially ions of one polarity and the second detecting electrode structure may be arranged to capture preferentially ions of the opposite polarity. In this arrangement, the first detecting electrode structure selectively captures one polarity of ions, while the second detecting electrode structure selectively captures the other polarity. In this way, each detecting electrode structure receives its own independent ion stream for detection and the signal at the second detecting electrode structure is not diminished by the operation of the first detecting electrode structure. In this way both detecting electrode structure can operate on the same ion stream.

The first detecting electrode structure may comprise a pair of spaced electrodes. An electric field may be applied between the electrodes, in use, to capture ions from the ionised gas flow and generate a current indicative of the ion distribution. Alternatively or in addition, the second detecting electrode structure may comprise a pair of spaced electrodes, and an electric field may be applied between the electrodes, in use, to capture ions from the ionised gas flow and generate a current indicative of the ion distribution.

The gas meter may comprise more than two detecting electrode structures, if desired.

In typical embodiments of the invention, the modulating voltage applied to the modulating electrode structure is at a frequency of less than 10 Hz. Similarly, the modulating voltage applied to the modulating electrode structure is generally less than 10 volts A.C. Furthermore, the voltage applied to the detecting electrode structure, if any, is generally less than 10 volts D.C. With these operating parameters, the gas meter is suited to battery-powered operation.

The gas meter according to the invention is suited to use as a domestic utility gas meter. By this is meant a gas meter that can be connected to a national, regional or international gas supply network at a user's premises and is sufficiently accurate to provide information on a user's gas usage to the network operator for billing purposes. However, the gas meter according to the invention may be used in other circumstances to measure gas volume, flow rate and/or velocity.

In embodiments of the invention, the ioniser is a radioactive source. However, other ionisers could be used, for examples ioniser operating by electrical discharge.

The conduit is typically a tube, which may have a circular cross-section. In embodiments of the invention, the width (diameter) of the tube is less than 30 mm.

Although the invention has been defined in terms of a gas meter, the invention extends to a method of gas metering and to means for gas metering as described herein.

BRIEF DESCRIPTION OF THE DRAWINGS

Embodiments of the invention will now be described by way of example only and with reference to the accompanying drawings, in which.

Corresponding reference numerals are used for corresponding parts in the various embodiments of the invention.

DETAILED DESCRIPTION OF EMBODIMENTS

Figure 1:
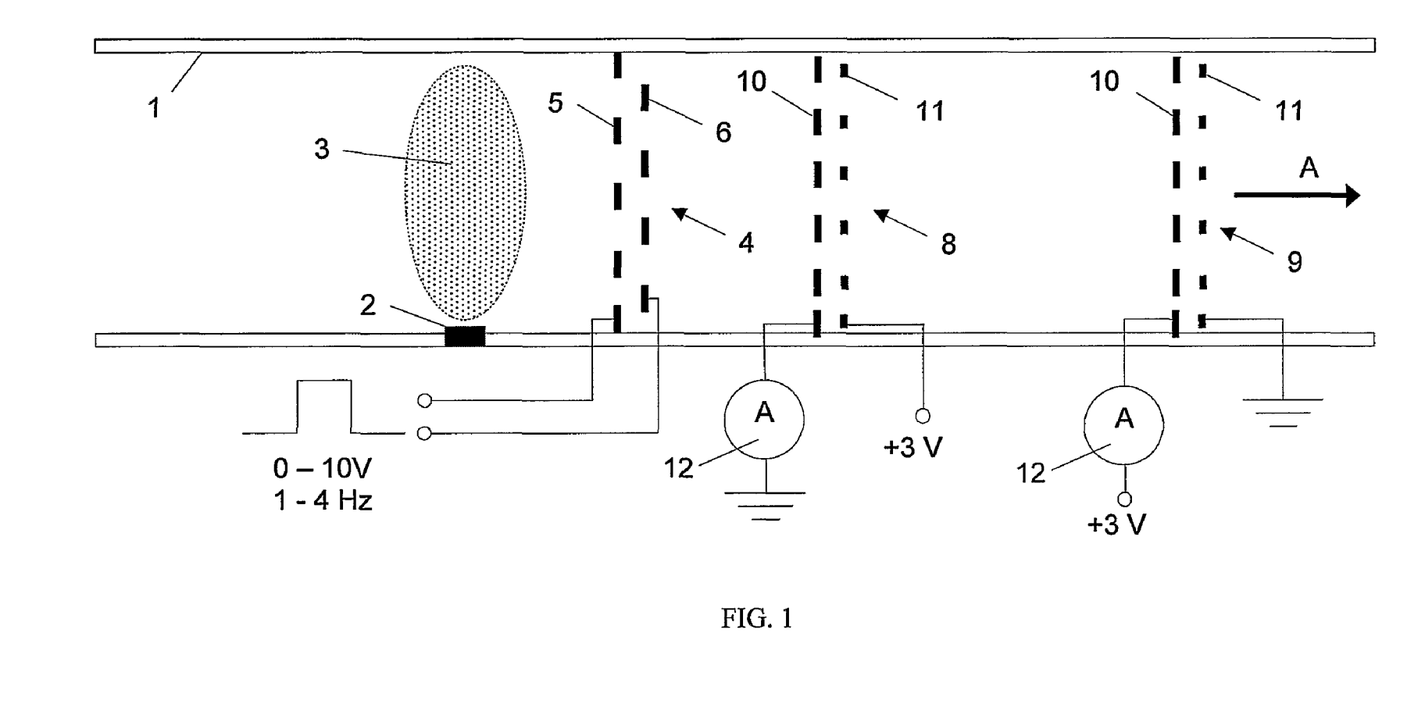
FIG. 1 is a schematic view of a gas meter according to a first embodiment of the invention.

FIG. 1 shows schematically a gas meter according to a first embodiment of the invention. The gas meter comprises a conduit 1 for passage of a gas flow, indicated by the arrow A. In this embodiment, the conduit is a cylindrical tube with an internal diameter of 23 mm. An ioniser 2 is arranged in the side of the tube 1 to ionise the gas flow in the conduit. In this embodiment, the ioniser 2 is a 1 μCi Americium 241 radioactive source trapped within silver or gold foil, of the type used in household smoke detectors. The source 2 typically has an emission rate of 37,000 alpha particles per second with a range of 3 cm in air. The ionisation efficiency is 200,000 ion pairs per alpha particle, with 50% recombination within 100 ms. The radiation source 2 ionises the gas in its immediate vicinity to form an ionisation cloud 3, which is carried through the tube 1 by the gas flow.

A modulating electrode structure 4 is provided in the tube 1 downstream of the radiation source 2. The modulating electrode structure 4 modulates the ion distribution in the ionised gas flow, so that the ionisation cloud is identifiable downstream of the modulating electrode structure 4. In this embodiment, the modulating electrode structure 4 comprises an upstream electrode 5 and a downstream electrode 6. As shown in FIG. 2, each electrode 5, 6 is in the form of a mesh (or grid) cut by a suitable method from sheet metal. The diameter of the electrodes 5, 6 corresponds to the internal diameter of the tube 1 and the electrodes are arranged perpendicularly to the axis of the tube 1, and hence the direction of gas flow. The electrodes 5, 6 have a thickness of 0.2 mm and a pitch p of 1 mm or less. The fill factor of the electrodes (area percentage of the mesh material) is 20% or less.

In this embodiment, the spacing between the upstream modulator electrode 5 and the downstream modulator electrode 6 is 0.125 mm. As indicated in FIG. 1, a varying modulation voltage is applied between the modulator electrodes 5, 6. The modulation voltage is a square wave with amplitude of up to 10 volts and a frequency of 1 to 4 hertz. The applied modulating voltage generates an electric field between the modulator electrodes 5, 6. As shown in FIG. 1, the meshes of the upstream modulator electrode 5 and the downstream modulator electrode 6 are relatively offset by an amount equal to half the pitch of the mesh, such that the conductors 7 between the spaces of one electrode are aligned with the spaces of the other electrode and vice versa. In this way, the electric field between the modulator electrodes 5, 6 has the maximum component in the direction perpendicular to the direction of gas flow (axis of the tube 1). Ideally, the conductors 7 of each electrode 5, 6 would be interleaved between the conductors of the other electrode in the same plane perpendicular to the direction of gas flow, so that the electric field between the two electrodes 5, 6 is entirely perpendicular to the direction of gas flow. However, such an arrangement leads to a modulating electrode structure 4 that is very complex and therefore difficult and expensive to manufacture. By spacing the electrodes 5, 6 in the direction of gas flow and offsetting the meshes, a compromise is struck between manufacturing ease and operational efficiency.

When the modulating voltage applied between the modulator electrodes 5, 6 is non-zero, the generated electric field directs the positive and negative ions in the ion cloud 3 towards respective modulator electrodes 5, 6 where they are captured. The high component of the electric field in the direction perpendicular to the direction of gas flow maximises the deviation of the ions towards the respective modulator electrodes 5, 6. The effect of the periodic modulating voltage is to generate in the gas flow downstream of the modulating electrode structure 4 sequential regions of high and low ion density. These regions can be detected to determine the time of flight of the regions and hence the flow rate of the gas, as described below.

The gas meter of FIG. 1 comprises a first detecting electrode structure 8 and a second detecting electrode structure 9 in the tube 1 downstream of the modulating electrode structure 4 to detect the modulated ion distribution in the ionised gas flow. The second electrode structure 9 is located downstream of the first detecting electrode structure 8. In this embodiment, the first and second detecting electrode structures 8, 9, each comprise an upstream electrode 10 and a downstream electrode 11. Each electrode 10, 11 has the general form of a mesh (or grid) cut by a suitable method from sheet metal, as shown in FIG. 2. The diameter of the electrodes 10, 11 corresponds to the internal diameter of the tube 1 and the electrodes 10, 11 are arranged perpendicularly to the axis of the tube 1, and hence the direction of gas flow. The electrodes 10, 11 have a thickness of 0.2 mm and a pitch p of 2 mm. The fill factor of the electrodes (area percentage of the mesh material) is 10% or less.

In this embodiment, the spacing between the upstream detector electrode 10 and the downstream detector electrode 11 is 0.125 mm. As shown in FIG. 1, the meshes of the upstream detector electrode 10 and the downstream detector electrode 11 are aligned. In this way, the electric field between the detector electrodes 10, 11 has the maximum component in the direction parallel to the direction of gas flow (axis of the tube 1). In this way, the electric field strength between the detector electrodes 10, 11 can be varied by varying the spacing of the electrodes 10, 11, without affecting the fluid flow through the conduit 1.

As indicated in FIG. 1, a detection voltage is applied between the detector electrodes 10, 11. In this embodiment, the detection voltage is a constant voltage of +3 volts D.C., which generates an electric field between the detector electrodes 10, 11. For the first detecting electrode structure 8, the upstream detecting electrode 10 is connected to earth potential and the downstream detecting electrode 11 is connected to +3 volts D.C. For the second detecting electrode structure 9, the downstream detecting electrode 11 is connected to earth potential and the upstream detecting electrode 10 is connected to +3 volts D.C. Thus, the direction of the electric field between the detector electrodes 10, 11 of the second detecting electrode structure 9 is reversed relative to that of the first detecting electrode structure 8.

It will be seen that the downstream electrode 11 of the first detecting electrode structure 8 and the upstream electrode 10 of the second detecting electrode structure 9 are both at the same potential. Consequently, there is no electric field between these two electrodes, such that ion transport between these electrodes is due only to the gas flow and not to electrical effects, which assists in accurate gas flow measurement. It is also possible for the downstream electrode 6 of the modulating electrode structure 4 and the upstream electrode 10 of the first detecting electrode structure 9 to both be at the same (earth) potential, such that there is no electric field between these two electrodes.

The first detecting electrode structure 8 preferentially captures positive ions, which are decelerated by the electric field between the positive downstream electrode 11 and the earthed upstream electrode 10. The same electric field acts to accelerate negative ions which pass through the first detecting electrode structure 8. The slowed positive ions which reach the earthed upstream electrode 10 are neutralised by electrons drawn as a current from the earth connection. This current can be measured by an ammeter 12 or other current measuring device.

The second electrode structure 9 captures negative ions, which are decelerated by the electric field between the positive upstream electrode 10 and the earthed downstream electrode 11. The slowed negative ions are captured by the positive upstream electrode 10, generating a current that can be measured by an ammeter 12 or other current measuring device. In this way, the gas meter has, in effect, two independent measurement channels: positive ions at the first detecting electrode structure 8 and negative ions at the second detecting electrode structure 9.

The distance between the downstream electrode 6 of the modulating electrode structure 4 and the upstream electrode 10 of the first detecting electrode structure 8 is 8 mm. The distance between the downstream electrode 6 of the modulating electrode structure 4 and the upstream electrode 10 of the second detecting electrode structure 9 is 70 mm. The provision of two spaced detecting electrode structures 8, 9 increases the dynamic range of the gas meter. For domestic applications, the typical measurement range of gas flow requiring a defined level of accuracy is between 40 litres per hour and 6,000 litres per hour, which represents a dynamic range of 150:1. According to this embodiment of the invention, the first detecting electrode structure 8 is used to determine low flow rates, where it is necessary to detect the modulated ion cloud before too many ions are lost from the modulated ion cloud due to recombination and the second detecting electrode structure 9 is used to determine high flow rates, where it is necessary to detect the modulated ion cloud before it has passed through the entire meter. The detected signals from both detecting electrode structures 8, 9 can be used to maximise accuracy of the meter across the entire measurement range.

Figure 3:
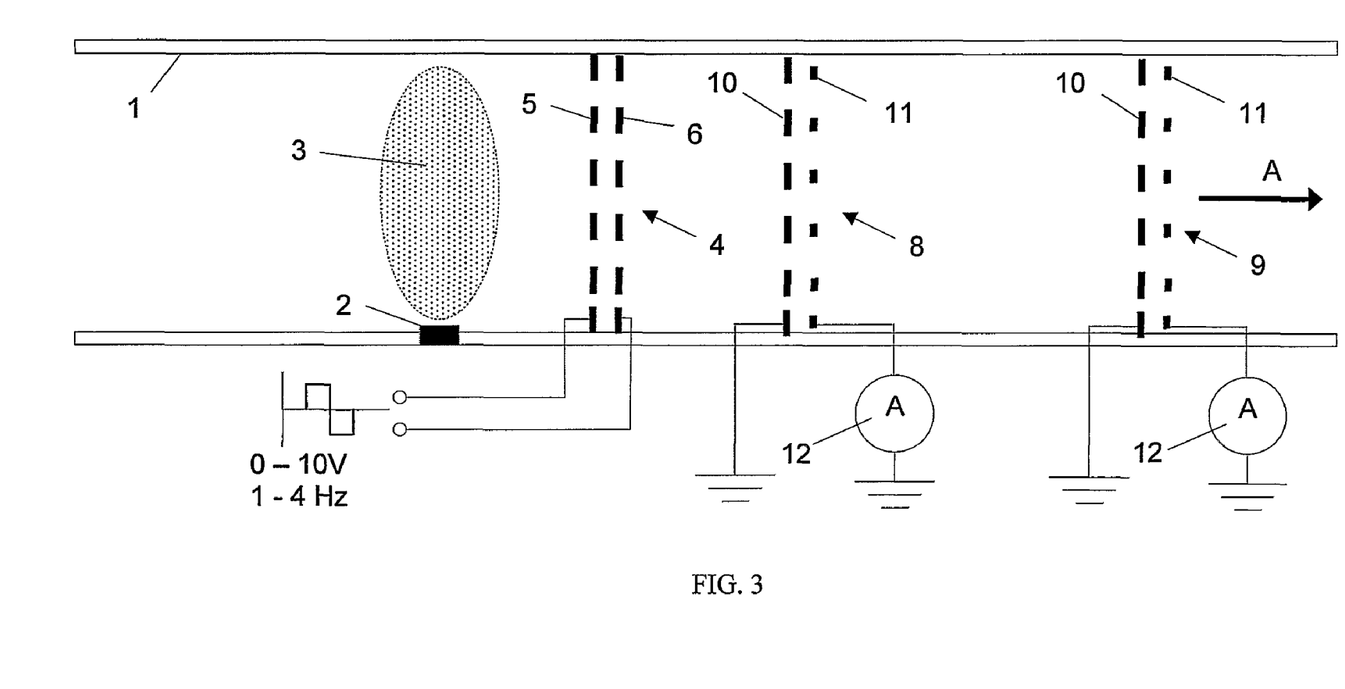
FIG. 3 is a schematic view of a gas meter according to a second embodiment of the invention.

FIG. 3 shows schematically a gas meter according to a second embodiment of the invention. The gas meter comprises a conduit 1 for passage of a gas flow, indicated by the arrow A. In this embodiment, the conduit is a cylindrical tube with an internal diameter of 23 mm. An ioniser 2 is arranged in the side of the tube 1 to ionise the gas flow in the conduit. In this embodiment, the ioniser 2 is a 1 µCi Americium 241 radioactive source trapped within silver or gold foil, of the type used in household smoke detectors. The source 2 typically has an emission rate of 37,000 alpha particles per second with a range of 3 cm in air. The ionisation efficiency is 200,000 ion pairs per alpha particle, with 50% recombination within 100 ms. The radiation source 2 ionises the gas in its immediate vicinity to form an ionisation cloud 3, which is carried through the tube 1 by the gas flow.

Figure 2:
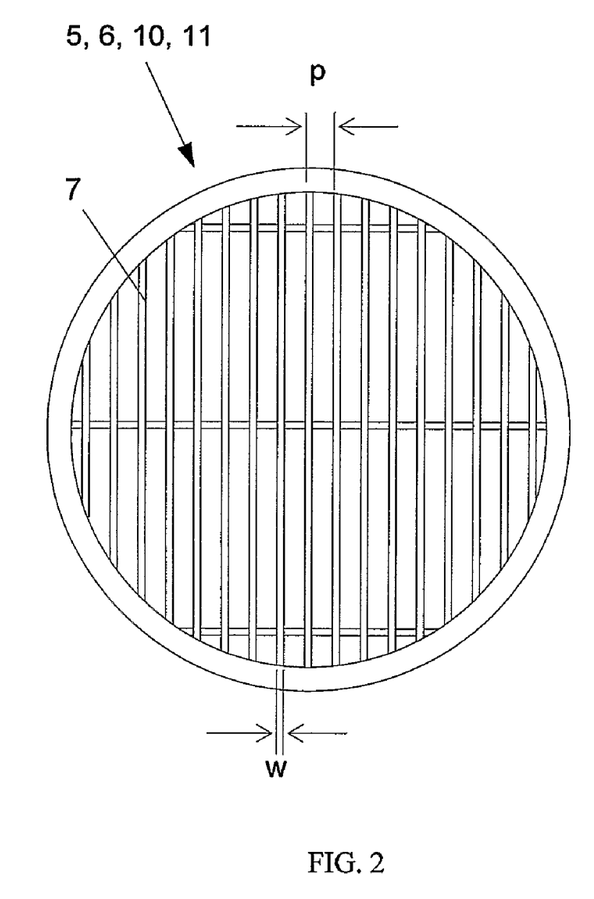
FIG. 2 shows a mesh electrode for use in gas meters according to the invention.

A modulating electrode structure 4 is provided in the tube 1 downstream of the radiation source 2. The modulating electrode structure 4 modulates the ion distribution in the ionised gas flow, so that the ionisation cloud is identifiable downstream of the modulating electrode structure 4. In this embodiment, the modulating electrode structure 4 comprises an upstream electrode 5 and a downstream electrode 6. As shown in FIG. 2, each electrode 5, 6 is in the form of a mesh (or grid) cut by a suitable method from sheet metal. The diameter of the electrodes 5, 6 corresponds to the internal diameter of the tube 1 and the electrodes are arranged perpendicularly to the axis of the tube 1, and hence the direction of gas flow. The electrodes 5, 6 have a thickness of 0.2 mm and a pitch p of 1 mm or less. The fill factor of the electrodes (area percentage of the mesh material) is 20% or less.

In this embodiment, the spacing between the upstream modulating electrode 5 and the downstream modulating electrode 6 is 0.125 mm. As shown in FIG. 3, the meshes of the upstream modulating electrode 5 and the downstream modulating electrode 6 are aligned. In this way, the electric field between the modulating electrodes 5, 6 has the maximum component in the direction parallel to the direction of gas flow (axis of the tube 1). In this way, the electric field strength between the modulating electrodes 5, 6 can be varied by varying the spacing of the electrodes 5, 6, without affecting the fluid flow through the conduit 1.

As indicated in FIG. 3, an alternating modulation voltage is applied between the modulator electrodes 5, 6. The modulation voltage is a square wave with amplitude of up to 10 volts and a frequency of 1 to 4 hertz. The applied modulating voltage generates an electric field between the modulator electrodes 5, 6. When the upstream modulator electrode 5 is positive relative to the downstream modulator electrode 6, the upstream modulator electrode 5 captures negative ions from the ion cloud 3 and accelerates positive ions through the modulating electrode structure 4. In this way, the ion cloud downstream of the modulating electrode structure 4 contains predominantly positive ions. When the upstream modulator electrode 5 is negative relative to the downstream modulator electrode 6, the upstream modulator electrode 5 captures positive ions from the ion cloud 3 and accelerates negative ions through the modulating electrode structure 4. In this way, the ion cloud downstream of the modulating electrode structure 4 contains predominantly negative ions. The effect of the alternating modulating voltage is to generate in the gas flow downstream of the modulating electrode structure 4 sequential regions of positive and negative ion density. These regions can be detected to determine the time of flight of the regions and hence the flow rate of the gas, as described below.

The gas meter of FIG. 3 comprises a first detecting electrode structure 8 and a second electrode structure 9 in the tube 1 downstream of the modulating electrode structure 4 to detect the modulated ion distribution in the ionised gas flow. The second electrode structure 9 is located downstream of the first detecting electrode structure 8. In this embodiment, the first and second detecting electrode structures 8, 9, each comprise an upstream electrode 10 and a downstream electrode 11. Each electrode 10, 11 has the general form of a mesh (or grid) cut by a suitable method from sheet metal, as shown in FIG. 2. The diameter of the electrodes 10, 11 corresponds to the internal diameter of the tube 1 and the electrodes 10, 11 are arranged perpendicularly to the axis of the tube 1, and hence the direction of gas flow. The electrodes 10, 11 have a thickness of 0.2 mm and a pitch p of 2 mm. The fill factor of the electrodes (area percentage of the mesh material) is 10% or less.

In this embodiment, the spacing between the upstream detector electrode 10 and the downstream detector electrode 11 is 0.125 mm. As shown in FIG. 3, the meshes of the upstream detector electrode 10 and the downstream detector electrode 11 are aligned. In this way, the relative electrical properties of the detector electrodes 10, 11 can be varied by varying the spacing of the electrodes 10, 11, without affecting the fluid flow through the conduit 1.

As indicated in FIG. 3, each of the detector electrodes 10, 11 is connected to ground potential. As the sequential regions of positive and negative ion density approach and pass the detector electrode structure 8, 9, the charge within the upstream detector electrode 10 redistributes in order to maintain zero potential within the electrode 10. This redistribution of charge causes a current to flow between the electrode 10 and ground potential. Similarly, the charge within the downstream detector electrode 11 redistributes in order to maintain zero potential within the electrode 11. This redistribution of charge causes a current to flow between the downstream detector electrode 11 and ground potential. This current can be measured by an ammeter 12 or other current measuring device and takes the form of an alternating signal from which the time of flight of the ion cloud can be determined by a comparison with modulating voltage. The downstream detector electrode 11 is selected for measurement of the redistribution current, because the upstream detector electrode 10 shields the downstream detector electrode 11 electromagnetically from the approaching ion distribution and the transition between positive and negative ion distributions is therefore more pronounced at the downstream detector electrode 11 than at the upstream detector electrode 10.

The distance between the downstream electrode 6 of the modulating electrode structure 4 and the upstream electrode 10 of the first detecting electrode structure 8 is 8 mm. The distance between the downstream electrode 6 of the modulating electrode structure 4 and the upstream electrode 10 of the second detecting electrode structure 9 is 70 mm. The provision of two spaced detecting electrode structures 8, 9 increases the dynamic range of the gas meter. For domestic applications, the typical measurement range of gas flow requiring a defined level of accuracy is between 40 litres per hour and 6,000 litres per hour, which represents a dynamic range of 150:1. According to this embodiment of the invention, the first detecting electrode structure 8 is used to determine low flow rates, where it is necessary to detect the modulated ion cloud before too many ions are lost from the modulated ion cloud due to recombination and the second detecting electrode structure 9 is used to determine high flow rates, where it is necessary to detect the modulated ion cloud before it has passed through the entire meter. The detected signals from both detecting electrode structures 8, 9 can be used to maximise accuracy of the meter across the entire measurement range.

Figure 4:
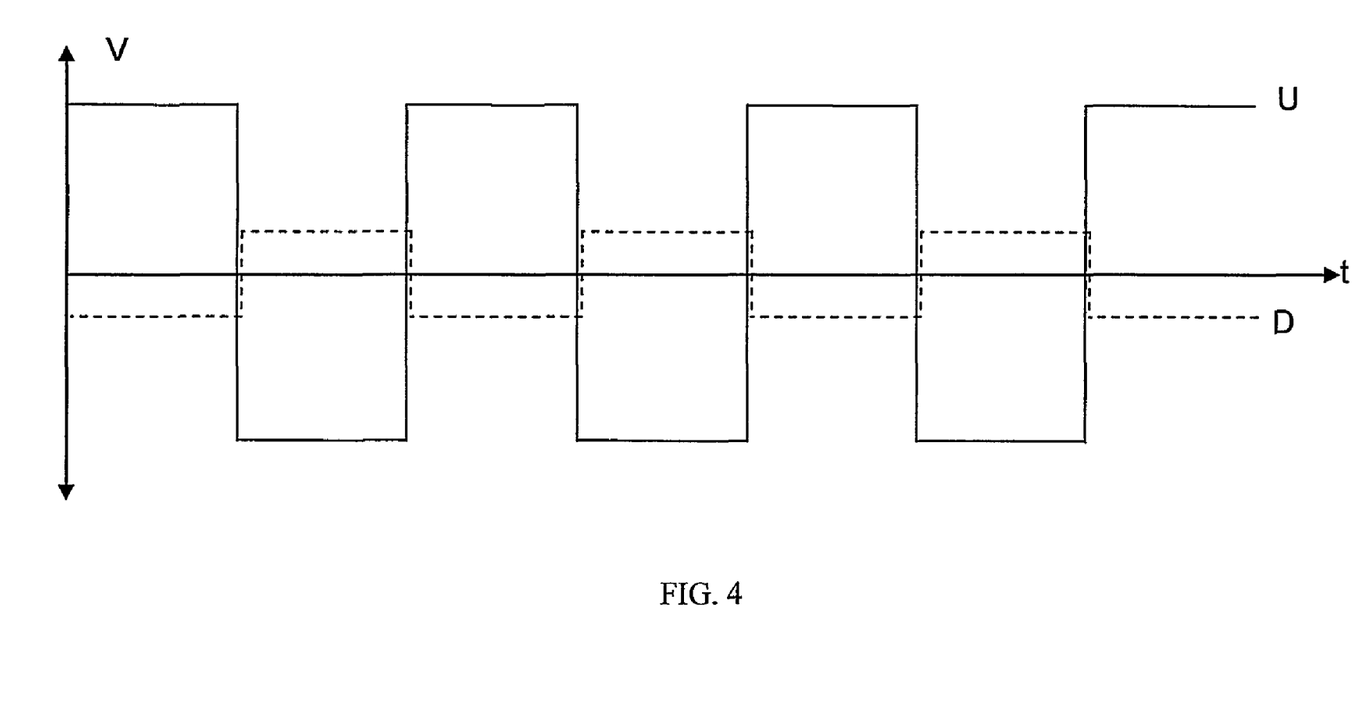
FIG. 4 is a schematic representation of the modulating voltage applied to the modulating electrode structure of the gas meter of FIG. 3.

In a refinement of the embodiments described above, an upstream modulating potential U and a downstream modulating potential D may be applied to the corresponding upstream and downstream modulating electrodes 5, 6 of the modulating electrode structure to provide the modulating voltage between the electrodes 5, 6. As shown in FIG. 4, the downstream modulating potential D may be chosen to be in anti-phase with the upstream modulating potential U and have amplitude selected to compensate for the far field effect of the electric field associated with the upstream modulating electrode 5. In other words, combined electromagnetic effect of the upstream and downstream modulating electrodes 5, 6 downstream of the modulating electrode structure 4 is cancelled out by the downstream modulating potential D. In this way, the modulating electrode structure 4 itself, as opposed to the resultant ion distribution, does not influence the signals generated by the first and second detecting electrode structures 8, 9.

It is possible for the gas meter to measure reverse gas flow in the conduit by providing further modulating and detecting electrode structures on the opposite side of the ioniser to the modulating electrode structure and detecting electrode structure described above. The further modulating and detecting electrode structures may be arranged as the mirror image of the modulating electrode structure and detecting electrode structure described above. However, in domestic metering applications, it may only be necessary to detect, rather than measure, reverse flow. Consequently, it may only be necessary to provide an electrode structure capable of detecting the presence of ionised gas upstream of the ioniser (due to reverse flow). For example, the electrode structure may be arranged to measure the impedance of the gas flow.

In summary, a gas meter comprises a conduit 1 for passage of a gas flow A and an ioniser 2 arranged to ionise the gas flow in the conduit 1. A modulating electrode structure 4 downstream of the ioniser modulates the ion distribution in the ionised gas flow. A first detecting electrode structure 8 and a second electrode structure 9 downstream of the modulating electrode structure 4 detect the modulated ion distribution in the ionised gas flow. The modulating electrode structure 4 and the detecting electrode structures 8, 9 can be configured to generate an electrical field having at least a substantial component parallel to the direction of the gas flow. The modulating electrode structure 4 and the detecting electrode structures 8, 9 can comprise a pair of electrodes 5, 6, 10, 11, each having a plurality of apertures defined therein for passage of the gas flow. The modulating electrode structure 4 can be arranged to capture ions of one polarity, to generate an ionised gas flow comprising a majority of ions of the opposite polarity, in which case the detecting electrode structure can comprise at least one electrode 11 connected to a source of charge. Movement of the ionised gas flow relative to the electrode causes a redistribution of charge in the electrode, which generates a current indicative of the ion distribution between the electrode 11 and the charge source.

The various arrangements provide a gas meter that can operate with a modulating voltage of less than 10 volts and is therefore suitable as a domestic gas meter. This has significant advantages relative to existing metering methods which cannot be used directly to meet the cost, power consumption or performance requirements for a self-contained volumetric gas meter. The typical reasons for this are:
  (a) they require high voltages to bias electrodes, which uses power and are a potential safety hazard;
  (b) they do not have sufficient dynamic range or linearity to meet the metrological requirements laid down by national standards bodies;
  (c) the activity of the radioactive sources used is larger than would be generally acceptable in a residential application;
  (d) they are not optimised for the typical measurement bandwidth and signal to noise ratio needed for a volumetric gas meter.

Particular embodiments of the invention allow these problems to be overcome or at least reduced.

Although the present invention has been described in relation to specific distinct embodiments, this is not intended to be limiting on the scope of this disclosure. Consequently, the skilled person will appreciate that features of one embodiment may be used in combination with features of a separated embodiment, even where this is not explicitly mentioned.

The invention claimed is:

1. A gas meter comprising:
   a conduit for passage of a gas flow;
   an ioniser arranged to ionise the gas flow in the conduit;
   a modulating electrode structure arranged for modulating the ion distribution in the ionised gas flow; and
   at least a first detecting electrode structure downstream of the modulating electrode structure arranged for detecting the modulated ion distribution in the ionised gas flow, wherein the modulating electrode structure is arranged downstream of the ioniser and is configured to generate an electrical field which is substantial in a parallel to the direction of the gas flow, wherein a current flow is generated between the detecting electrode and a ground potential, from which flow rate is determined.

2. A gas meter as claimed in claim 1, wherein the detecting electrode structure is configured to generate an electrical field which is substantial in a parallel to the direction of the gas flow.

3. A gas meter as claimed in claim 1, wherein the modulating electrode structure comprises a pair of opposed substantially planar electrodes arranged substantially perpendicularly to the direction of the gas flow.

4. A gas meter as claimed in claim 3, wherein the electrodes are spaced in the direction of the gas flow.

5. A gas meter as claimed in claim 3, wherein the electric field is generated between the electrodes.

6. A gas meter as claimed in claim 3, wherein the electrodes each have a plurality of apertures defined therein for passage of the gas flow therethrough.

7. A gas meter as claimed in claim 6, wherein the electrode is in the form of a mesh.

8. A gas meter as claimed in claim 1, wherein the detecting electrode structure comprises a pair of opposed substantially planar electrodes arranged substantially perpendicularly to the direction of the gas flow.

9. A gas meter as claimed in claim 1, wherein the modulating electrode structure comprises an upstream electrode and a downstream electrode, and a respective modulating potential is applied, to each electrode to modulate the ion distribution in the ionised gas flow, wherein the modulating potential applied to the downstream electrode is of the opposite polarity to the modulating potential applied to the upstream electrode and of a magnitude selected such that, downstream of the modulating electrode structure, the electric field due to the upstream electrode is cancelled by the electric field due to the downstream electrode.

10. A gas meter as claimed in claim 1, wherein the modulating electrode structure is arranged to capture ions of one polarity, whereby to generate an ionised gas flow comprising a majority of ions of the opposite polarity.

11. A gas meter as claimed in claim 10, wherein the detecting electrode structure comprises at least one electrode connected to a source of charge, whereby movement of the ionised gas flow having a majority of ions of one polarity relative to the electrode causes a redistribution of charge in the electrode, which generates a current indicative of the ion distribution between the electrode and the charge source.

12. A gas meter as claimed in claim 11, wherein the source of charge is ground potential.

13. A gas meter as claimed in claim 1, further comprising a second detecting electrode structure downstream of the first detecting electrode structure, each detecting electrode structure arranged for detecting the modulated ion distribution in the ionised gas flow.

14. A gas meter as claimed in claim 1, wherein the first detecting electrode structure is arranged to capture preferentially ions of one polarity and the second detecting electrode structure is arranged to capture preferentially ions of the opposite polarity.

15. A gas meter as claimed in claim 14, wherein the first detecting electrode structure comprises a pair of spaced electrodes, and an electric field is applied between the electrodes, to capture ions from the ionised gas flow and generate a current indicative of the ion distribution.

16. A gas meter as claimed in claim 14, wherein the second detecting electrode structure comprises a pair of spaced electrodes, and an electric field is applied between the electrodes to capture ions from the ionised gas flow and generate a current indicative of the ion distribution.

17. A gas meter as claimed in claim 1, wherein the ioniser comprises a radioactive source.

18. A gas meter as claimed in claim 1, wherein the meter is battery powered.